(12) United States Patent
Vermeersch et al.

(10) Patent No.: US 6,846,613 B2
(45) Date of Patent: Jan. 25, 2005

(54) POSITIVE-WORKING LITHOGRAPHIC PRINTING PLATE PRECURSORS

(75) Inventors: Joan Vermeersch, Deinze (BE); Marc Van Damme, Bonheiden (BE)

(73) Assignee: AGFA-Gevaert, Mortsel (BE)

( * ) Notice: Subject to any disclaimer, the term of this patent is extended or adjusted under 35 U.S.C. 154(b) by 0 days.

(21) Appl. No.: 10/116,948

(22) Filed: Apr. 5, 2002

(65) Prior Publication Data

US 2002/0146644 A1 Oct. 10, 2002

Related U.S. Application Data

(60) Provisional application No. 60/291,813, filed on May 16, 2001.

(30) Foreign Application Priority Data

Apr. 9, 2001 (EP) .............................. 01000109

(51) Int. Cl.[7] .......................... B41C 1/10; G03F 7/075; G03F 7/11; G03F 7/30
(52) U.S. Cl. .................... 430/272.1; 430/155; 430/160; 430/273.1; 430/271.1; 430/302; 430/944; 101/451
(58) Field of Search .......................... 101/451; 430/302, 430/155, 160, 273.1, 271.1, 272.1

(56) References Cited

U.S. PATENT DOCUMENTS

2002/0187425 A1 * 12/2002 Savariar-Hauck et al. ........................ 430/273.1

FOREIGN PATENT DOCUMENTS

| EP | 0 940 266 A1 | | 9/1999 |
|---|---|---|---|
| EP | 0 950 514 A1 | | 10/1999 |
| EP | 0950518 A1 | * | 10/1999 |
| EP | 0950516 a1 | * | 10/1999 |
| EP | 0960728 A1 | * | 12/1999 |
| JP | 56080047 | | 7/1981 |
| JP | 59135471 | | 8/1984 |
| JP | 60254035 | | 12/1985 |

OTHER PUBLICATIONS

Product Data Sheet Tego Glide 410; Slip and flow additive, one page, Issue date of Mar. 1999 from Tego Chemie Service GmbH, obtained from www.alpchemicals.com.tr/pdf/Glide%20410_e.pdf.*
Search Report for EP 01 00 0109 dated Sep. 6, 2001.

* cited by examiner

Primary Examiner—Cynthia Hamilton
(74) Attorney, Agent, or Firm—Leydig, Voit&Mayer Ltd.

(57) ABSTRACT

A positive-working printing plate precursor for wet lithographic printing is disclosed which comprises a support having a hydrophilic surface and a coating comprising a first layer closest to the support, said first layer containing an oleophilic phenolic resin soluble in an aqueous alkaline developer, and a second layer containing an amphyphilic polymer, wherein (a) the second layer is capable of preventing the aqueous alkaline developer from penetrating into the first layer to an extent that substantially no dissolution of unexposed coating occurs upon immersion in the aqueous alkaline developer during a time period $t_2$;

(b) and wherein said capability of the second layer of preventing the aqueous alkaline developer from penetrating into the first layer is reduced upon exposure to heat or light to an extent that substantially complete dissolution of exposed coating occurs upon immersion in the aqueous alkaline developer during a time period $t_1$;

wherein $t_2 > t_1$ and $t_2 - t_1$ is at least 10 seconds; and wherein the amphyphilic polymer is a block- or graft-copolymer comprising (i) a poly(alkylene oxide) block and (ii) a block comprising siloxane and/or perfluorohydrocarbon units.

16 Claims, 1 Drawing Sheet

POSITIVE-WORKING LITHOGRAPHIC PRINTING PLATE PRECURSORS

This application claims the benefit of U.S. Provisional Patent Application No. 60/291,813, filed May 16, 2001, which is incorporated by reference.

FIELD OF THE INVENTION

The present invention relates to a positive-working printing plate precursor that is suitable for wet lithographic printing.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the so-called computer-to-film method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master.

A typical printing plate precursor for computer-to-film methods comprise a hydrophilic support and an image-recording layer of a photosensitive polymer layers which include UV-sensitive diazo compounds, dichromate-sensitized hydrophilic colloids and a large variety of synthetic photopolymers. Particularly diazo-sensitized systems are widely used. Upon image-wise exposure, typically by means of a film mask in a UV contact frame, the exposed image areas become insoluble and the unexposed areas remain soluble in an aqueous alkaline developer. The plate is then processed with the developer to remove the diazonium salt or diazo resin in the unexposed areas. So the exposed areas define the image areas (printing areas) of the printing master, and such printing plate precursors are therefore called 'negative-working'. Also positive-working materials, wherein the exposed areas define the non-printing areas, are known, e.g. plates having a novolac/naphtoquinone-diazide coating which dissolves in the developer only at exposed areas.

In addition to the above photosensitive materials, also heat-sensitive printing plate precursors are known. Such materials offer the advantage of daylight stability and are especially used in the is so-called computer-to-plate method wherein the plate precursor is directly exposed, i.e. without the use of a film mask. The material is exposed to heat or to infrared light and the generated heat triggers a (physico-) chemical process, such as ablation, polymerization, insolubilization by cross-linking of a polymer, decomposition, or particle coagulation of a thermoplastic polymer latex.

U.S. Pat. No. 5,466,557 describes a positive-working printing plate precursor which is sensitive to both ultraviolet (UV) and infrared (IR) light but not to visible light, comprising a support and a coating comprising an oleophilic polymer that is soluble in an aqueous alkaline developer and a latent Bronsted acid.

WO 97/39894 describes a positive-working heat-sensitive printing plate precursor which is sensitive to IR light but not to UV light comprising a support and an IR-sensitive coating comprising an oleophilic polymer that is soluble in an aqueous alkaline developer and a dissolution inhibitor which reduces the solubility of the polymer in the developer.

The major problem associated with the above prior art materials is the low differentiation between the development kinetics of exposed and non-exposed areas, i.e. the dissolution of the exposed coating in the developer is not completely finished before the unexposed coating also starts dissolving in the developer. This leads to low quality prints showing unsharp edges and toning (ink-acceptance in exposed areas).

EP-A 864 420 describes a positive-working heat-sensitive printing plate precursor comprising a support, a first layer containing an oleophilic polymer that is soluble in an aqueous alkaline developer and an IR-sensitive top layer of which the; penetrability by or solubility in the aqueous alkaline developer is changed upon exposure to IR light.

WO99/21725 and WO99/21715 describe a positive-working heat-sensitive printing plate precursor of which the coating comprises a compound which increases the developer resistance thereof. Said compound is selected from the group consisting of poly(alkylene oxide), siloxanes and esters, ethers or amides of polyhydric alcohols. The coating needs a heat treatment in order to avoid that the sensitivity changes over time.

SUMMARY OF THE INVENTION

It is an aspect of the present invention to provide a positive-working printing plate precursor for wet lithographic printing which shows a high differentiation between exposed and non-exposed areas and which has a good shelf life without heat treatment, i.e. its sensitivity does not substantially change over time.

A printing plate precursor as defined in claim 1 exhibits a rapid dissolution of exposed areas in the aqueous alkaline developer and a much slower dissolution of the non-exposed areas. At the first time period designated as $t_1$ in FIG. 1, the exposed areas are completely dissolved, whereas dissolution of the non-exposed areas starts later, after the second time period designated as $t_2$ in FIG. 1. The development latitude, defined as the time difference $t_2-t_1$, is at least 10 seconds, more preferably at least 20 seconds and most preferably at least 40 seconds. The material has a high sensitivity immediately after coating and is stable over time.

Further advantages and embodiments of the present invention will become apparent from the following description.

DETAILED DESCRIPTION OF THE INVENTION

Figure 1:
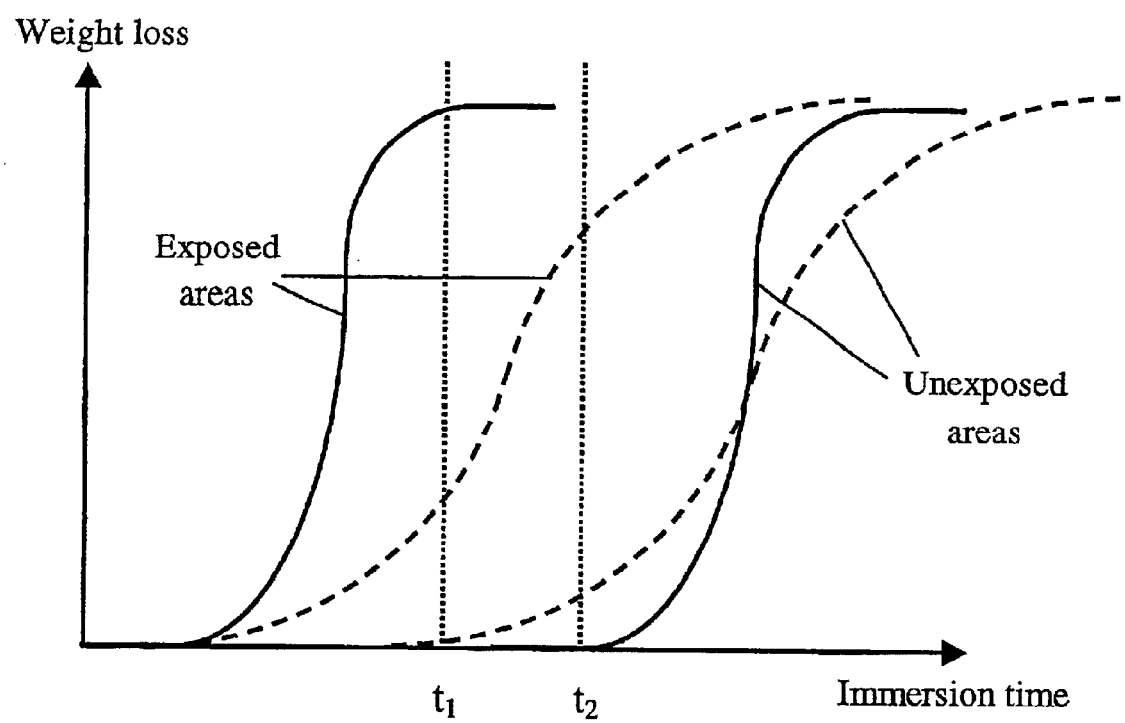
FIG. 1 shows schematically the development kinetics; expressed as weight loss of the coating during development, of exposed and non-exposed areas of a positive-working lithographic printing plate precursor according to the invention (solid lines) and of a material which does not comply with the requirements of the invention (dashed lines).

The lithographic printing plate precursor of the present invention contains a support having a hydrophilic surface and a coating provided thereon. The printing plate precursor is positive-working, working, i.e. after exposure and development the exposed areas of the coating are removed from the support and define hydrophilic (non-printing) areas, whereas the unexposed coating is not removed from the support and defines an oleophilic (printing) area. The coating comprises at least two layers, designated herein as first and second layer, the first layer being closest to the support, i.e. located between the support and the second layer. The second layer is also referred to herein as the barrier layer because it acts as a barrier that prevents penetration of the aqueous alkaline developer into the phenolic resin of the first layer at unexposed areas. The barrier function of the second layer probably arises from the water-repelling repelling properties of the siloxane or perfluorohydrocarbon block of the amphyphilic polymer.

The solubility of the second layer in the developer or the penetrability of the second layer by the developer can be reduced by exposure to heat or light. As a result, exposed areas dissolve rapidly in the developer. The barrier function of the second layer enables to obtain a long development time window due to a large difference of the dissolution rate between exposed and non-exposed areas of an image-wise exposed precursor. A poor barrier function leads to an unsatisfactory development latitude, as shown by the dashed curves in FIG. 1: development of the exposed areas is not completed before the start of the development of the non-exposed areas. The S-shaped curves in FIG. 1 reach a plateau when the coating is completely dissolved and, as a result, no further weight loss is measured. An exposed material according to the invention (solid lines in FIG. 1) shows a substantially complete dissolution of the coating after a development time $t_1$, whereas substantially no dissolution of a non-exposed sample occurs until $t_2$. "Substantially complete dissolution" shall be understood as a degree of dissolution of the coating which is sufficient to preclude toning, due to ink-acceptance of exposed coating that remains on the support after development. "Substantially no dissolution" shall be understood as a degree of dissolution which does not lead to a prohibitive reduction of the ink coverage on the prints, which is especially noticeable at the edges of the printing areas. Sharp edges of the printing areas and no toning in the non-printing areas are preferred characteristics of prints produced by the materials of the present invention.

Heat-sensitive materials normally show a "binary" sensitometric behavior, i.e. once a certain threshold temperature is reached in the coating during exposure, the imaging mechanism is triggered, leading to complete dissolution of the coating within a time $t_1$, which cannot significantly be reduced by applying higher amounts of energy during the exposure. However, in some materials the value of $t_1$ may be dependent on the amount of energy that is used during the exposure, more particularly there may be materials wherein the value of $t_1$ gradually decreases as a function of increasing exposure energy and then stabilizes at still higher values:in such cases, the dissolution rate and hence also $t_1$ normally becomes independent of the exposure energy above a certain value $\epsilon$. For such materials the term "exposure", as used in the claims, corresponds to that value $\epsilon$.

In another embodiment, the barrier function of the second layer can also be reduced by simple rubbing. A preferred second layer is capable of being removed by rubbing to an extent that substantially complete dissolution of rubbed coating occurs upon immersion in the aqueous alkaline developer during a time period $t_3$ of 10 seconds, said rubbing being defined as rubbing with a cotton pad of a size 85×85 mm at a pressure of 9.69 g/cm$^2$ during 50 cycles, each cycle being defined as a linear translation of the cotton pad on the coating over a distance of 30 cm at a speed of 0.40 m/s. Said distance is the distance between the position of the tailing edge at the beginning of a translation and the position of the leading edge at the end of a translation. The cotton pad is preferably of the type 4-4931 from A. B. Dick.

Whilst the applicants do not wish to be limited by any theoretical explanation of how their invention operates, it is believed that the spreading of the second layer on the first layer is reduced by the exposure, e.g. by 'thermal de-wetting', i.e. heat-induced decrease of the surface tension of the amphyphilic polymer, to such an extent that the second layer breaks up, thereby forming an incomplete layer which can no longer shield the first layer from the developer completely. Rubbing with a cotton pad also removes a sufficient amount of the amphyphilic polymer to trigger development. The removal of the amphyphilic polymer by rubbing can be measured e.g. by comparing the ratio of the siloxane $^1$H-NMR signals versus the signals of the phenolic resin of a sample before and after rubbing.

The second layer comprises an amphyphilic polymer which is a block- or graft-copolymer comprising a poly (alkylene oxide) block and a block of siloxane and/or perfluorohydrocarbon units. It is believed that such a copolymer, due to its amphyphilic structure, positions itself during coating at the interface between the coating solution and air and thereby automatically forms a separate top layer, corresponding to the second layer of the present invention, even when applied as an ingredient of the coating solution of the oleophilic layer. This may explain why a stable sensitometry is obtained without heat treatment immediately after coating, contrary to the non-amphyphilic polymers as disclosed in WO99/21715: the prior art polymers need heating, probably in order to induce diffusion of these polymers to the upper surface of the coating. Simultaneously, the amphyphilic polymer also acts as a spreading agent which improves the coating quality.

Alternatively, the amphyphilic polymer can be applied in a second solution, coated on top of the first layer. In that embodiment, it may be advantageous to use a solvent in the second coating solution that is not capable of dissolving the ingredients present in the first layer so that a phase of highly concentrated amphyphilic polymer is obtained at the top of the material.

The block comprising the siloxane and/or perfluorohydrocarbon units may be a linear, branched, cyclic or complex crosslinked polymer. The perfluorohydrocarbon unit is e.g. a —(CF$_2$)—unit. The number of such units may be larger than 10, preferably larger than 20. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes, e.g. phenylmethylsiloxanes and dimethylsiloxanes. The number of siloxane groups in the (co)polymer is at least 2, preferably at least 10, more preferably at least 20. It may be less than 100, preferably less than 60. The alkylene oxide block preferably includes units of the formula —C$_n$H$_{2n}$—O—wherein n is preferably an integer in the range 2 to 5. The moiety —C$_n$H$_{2n}$— may include straight or branched chains. The alkylene moiety may also comprise optional substituents. Preferred embodiments and explicit examples of such polymers have been disclosed in WO99/21725. A suitable amphyphilic polymer comprises about 15 to 25 siloxane units and 50 to 70 alkylene oxide groups. Preferred examples include copolymers comprising phenylmethylsiloxane and/or dimethylsiloxane as well as ethylene oxide and/or propylene oxide. Specific compounds are the following:

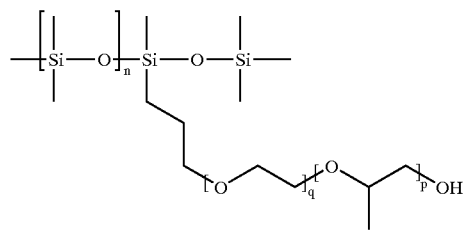
(I)

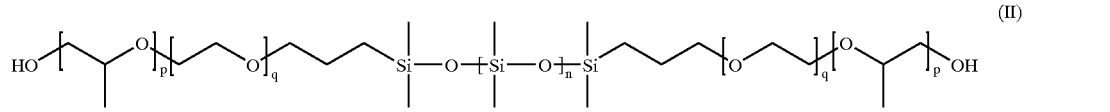
(II)

wherein n, p and q are integers >1. In formula I, a poly (alkylene oxide) block consisting of ethylene oxide and propylene oxide units is grafted to a polysiloxane block. In formula II, two poly(alkylene oxide) blocks are coupled to a polysiloxane block to form a linear block-copolymer. In each block, different units may be present in random order, e.g. the poly(alkylene oxide) block may be a random polymer of ethylene oxide and propylene oxide units.

Besides the amphiphilic polymer, other ingredients may also be contained in the second layer, e.g. the phenolic resin of the first layer may also be present in the second. More preferably, the second layer does not contain other binders besides the amphiphilic polymer and most preferably, the second layer consists essentially of the amphiphilic polymer. In one embodiment, the second layer contains the amphyphilic polymer in an amount between 0.5 and 25 mg/m², preferably between 0.5 and 15 mg/m² and most preferably between 0.5 and 10 mg/m². Since the amphyphilic polymer is also ink-repelling, higher amounts than 25 mg/M² can result in poor ink-acceptance of the non-exposed areas. An amount lower than 0.5 mg/m² on the other hand may lead to an unsatisfactory development resistance.

The phenolic resin in the first layer is an oleophilic polymer that is soluble in an aqueous developer, more preferably an aqueous alkaline developing solution with a pH between 7.5 and 14. Preferred polymers are e.g. novolac, resoles, polyvinyl phenols and carboxy substituted. Typical examples of these polymers are described in DE-A-4007428, DE-A-4027301 and DE-A-4445820.

The coating preferably comprises a dye or pigment which sensitizes the material to the light used during the exposure. It is preferably a compound or particle having an absorption maximum in the wavelength range between 250 and 1500 nm. According to a more preferred embodiment, the material is sensitive to'UV light (<400 nm) and/or IR light (>750 nm) but not to visible light (400–750 nm). Most preferably, the material is not sensitive to ambient daylight, i.e. light in the near UV (300–400 nm) and visible wavelength range at an intensity and exposure time corresponding to normal working conditions so that the material can be handled without the need for a safe light environment. "Not sensitive" shall mean that no substantial change of the dissolution rate of the coating in the developer is induced by the exposure.

Preferred IR-absorbing compounds are dyes such as cyanine dyes or pigments such as carbon black. Preferred UV-absorbing compounds are capable of generating a radical upon exposure to UV light. Suitable UV-sensitizers can be selected from the group consisting of a compound having a carbon-halogen bond, an aromatic onium salt, an organic peroxide, a thio compound, a hexaarylbisimidazole or a ketoxime ester. Specific examples of such compounds can be found in U.S. Pat. Nos. 5,049,481 and 5,466,557. Preferably s-triazines, thioxanthones, hexaaryl-bisimidazoles or mercaptobenzoxazoles are used.

The sensitizing dye or pigment may be present in the first and/or the second layer. According to a highly preferred embodiment, the dye or pigment is concentrated in or near the second layer, e.g. in an intermediate layer between the first and the second layer. According to that embodiment, said intermediate layer comprises the light absorbing compound in an amount higher than the amount of light absorbing compound in the first or in the second layer. In a preferred embodiment, the second layer comprises no effective amount of sensitizing dye.

The first layer may further contain other ingredients such as additional binders to improve the run length of the plate, colorants, development inhibitors as disclosed in EP-A 823 327 and WO 97/39894 or development accelerators. Said colorants are preferably dyes which during development remain in the coating at non-exposed areas and which are washed out at exposed areas, thereby producing a visible image. Such indicator dyes preferably do not sensitize the coating to visible light. Suitable development accelerators are described in e.g. EP-A 933 682. Such compounds act as dissolution promoters because they are capable of reducing the dissolution time of the oleophilic layer. For example, cyclic acid anhydrides, phenols or organic acids can be used in order to improve the aqueous developability. Examples of the cyclic acid anhydride include phthalic anhydride, tetrahydrophthalic anhydride, hexahydrophthalic anhydride, 3,6-endoxy-4-tetrahydrophthalic anhydride, tetrachlorophthalic anhydride, maleic anhydride, chloromaleic anhydride, alpha -phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxy-benzophenone, 4-hydroxybenzophenone, 4,4',4"-trihydroxy-triphenylmethane, and 4,4',3",4"-tetrahydroxy-3,5,3',5'-tetramethyltriphenyl-methane, and the like. Examples of the organic acids include sulfonic acids, sulfinic acids, alkylsulfuric acids, phosphonic acids, phosphates, and carboxylic acids, as described in, for example, JP-A Nos. 60-88,942 and 2-96,755. Specific examples of these organic acids include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the image forming composition is preferably in the range of 0.05 to 20% by weight.

The support has a hydrophilic surface or is provided with a hydrophilic layer. The support may be a sheet-like material such as a plate or it maybe a cylindrical element such as a sleeve which can be slid around a print cylinder of a printing press. Preferably, the support is a metal support such as aluminum or stainless steel.

A particularly preferred lithographic support is an electrochemically grained and anodized aluminum support. The anodized aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde It is further evident that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 901, EP-A-291 760 and U.S. Pat. No. 4,458,005.

According to another embodiment, the support can also be a flexible support, which is provided with a hydrophilic layer, hereinafter called 'base layer'. The flexible support is e.g. paper, plastic film, thin aluminum or a laminate thereof. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 µm and is preferably 1 to 10 µm.

The hydrophilic binder for use in the base layer is e.g. a hydrophilic (co)polymer such as homopolymers and copolymers of vinyl alcohol, acrylamide, methylol acrylamide, methylol methacrylamide, acrylate acid, methacrylate acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60% by weight, preferably 80% by weight.

The amount of hardening agent, in particular tetraalkyl orthosilicate, is preferably at least 0.2 parts per part by weight of hydrophilic binder, more preferably between 0.5 and 5 parts by weight, most preferably between 1 parts and 3 parts by weight.

The hydrophilic base layer may also contain substances that increase the mechanical strength and the porosity of the layer. For this purpose colloidal silica may be used. The colloidal silica employed may be in the form of any commercially available water dispersion of colloidal silica for example having an average particle size up to 40 nm, e.g. 20 nm. In addition inert particles of larger size than the colloidal silica may be added e.g. silica prepared according to Stbber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the hydrophilic base layer is given a uniform rough texture consisting of microscopic hills and valleys, which serve as storage places for water in background areas.

Particular examples of suitable hydrophilic base layers for use in accordance with the present invention are disclosed in is EP-A-601 240, GB-P-1 419 512, FR-P-2 300 354, U.S. Pat. No. 3,971,660, and U.S. Pat. No. 4,284,705.

It is particularly preferred to use a film support to which an adhesion improving layer, also called support layer, has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 mg/M$^2$ and 750 mg/M$^2$. Further, the ratio of silica to hydrophilic binder is preferably more than 1 and the surface area of the colloidal silica is preferably at least 300 m$^2$/gram, more preferably at least 500 m$^2$/gram.

The printing plate precursor of the present invention can be exposed to heat or to light, e.g. by means of a thermal head, LEDs or a laser head. Preferably, one or more lasers such as a He/Ne laser, an Ar lasers or a violet laser diode are used. Most preferably, the light used for the exposure is not visible light, e.g. UV (laser) light or a laser emitting near infrared light having a wavelength in the range from about 750 to about 1500 nm is used, such as a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at 1/e$^2$ of maximum intensity: 10–25 µm), the scan speed and the resolution of the exposure apparatus (i.e. the number of addressable pixels per unit of linear distance, often expressed in dots per inch or dpi; typical value: 1000–4000 dpi).

Two types of laser-exposure apparatuses are commonly used: internal (ITD) and external drum (XTD) plate-setters. ITD plate-setters for thermal plates are typically characterized by a very high scan speed up to 500 m/sec and may require a laser power of several Watts. XTD plate-setters for thermal plates having a typical laser power from about 200 mW to about 1 W operate at a lower scan speed, e.g. from 0.1 to 10 m/sec.

The known plate-setters can be used as an off-press exposure apparatus, which offers the benefit of reduced press down-time. XTD plate-setter configurations can also be used for the on-press exposure, offering the benefit of immediate registration in a multi-color press. More technical details of on-press exposure apparatuses are described in e.g. U.S. Pat. Nos. 5,174,205 and 5,163,368.

In the development step, the exposed areas of the coating are removed by immersion in an aqueous alkaline developer, which may be combined with mechanical rubbing, e.g. by a rotating brush. The immersion time lies between $t_1$ and $t_2$ so that the exposed areas are dissolved completely before the non-exposed areas are affected by the developer. The development step may be followed by a drying step, a rinsing step, a gumming step, and/or a post-baking step.

The printing plate thus obtained can be used for conventional, so-called wet offset printing, in which ink and an aqueous dampening liquid is supplied to the plate. Another suitable printing method uses so-called single-fluid ink without a dampening liquid. Single-fluid inks which are suitable for use in the method of the present invention have been described in U.S. Pat. Nos. 4,045,232; 4,981,517 and 6,140,392. In a most preferred embodiment, the single-fluid ink comprises an ink phase, also called the hydrophobic or oleophilic phase, and a polyol phase as described in WO 00/32705.

EXAMPLES

Preparation of the Lithographic Base

A 0.30 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 A/m² to form a surface topography with an average center-line roughness Ra of 0.5 μm.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 A/m² for about 300 seconds to form an anodic oxidation film of 3.00 g/m² of $Al_2O_3$ then washed with demineralized water, post-treated with a solution containing polyvinylphosphonic acid and subsequently with a solution containing aluminum trichloride, rinsed with demineralized water at 20° C. during 120 seconds and dried.

Preparation of a Lithographic Printing Plate Precursor

An IR-sensitive layer was coated onto the above described lithographic base from a tetrahydrofuran/methoxypropanol mixture (50:50 vol. ratio) at 20 μm coating thickness. After drying the layer consisted of 0.13 g/m² of 3,4,5-trimethoxybenzoic acid, 35 mg/m² of infrared dye IR-1, 0.9 g/m² of ALNOVOL SPN452 (novolac available from Clariant, Germany) and 13 mg/m² of Flexoblau 630 (an indicator dye available from BASF).

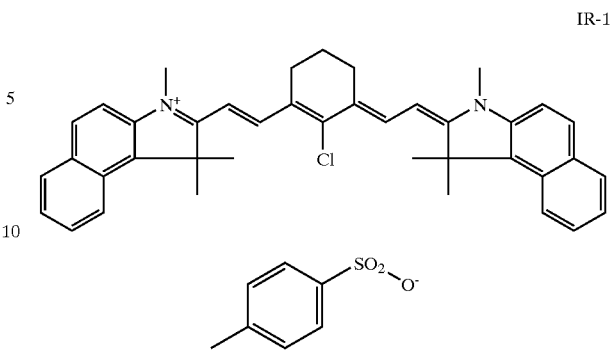

IR-1

Then, a second coating of 5 mg/m² of a polysiloxane polyether copolymer (TEGO GLIDE 410, commercially available from Tego Chemie Service GmbH) was applied on the first layer using isopropanol/water (25:75 vol. ratio) as a solvent.

This material was imaged with a TRENDSETTER 3244-T (available from Creo) external drum platesetter operation at 830 nm, 2400 dpi, 150 rpm resulting in an energy-density of 140 mJ/cm². After IR-imaging the material was developed during 25 seconds in an Autolith T processor (available from Agfa-Gevaert) using an OZASOL EP26™ developer (also available from Agfa-Gevaert) at 25° C. The processor also contained a rinsing section (water) and a gumming section (RC795 gum from Agfa-Gevaert). The IR-exposed areas dissolved very rapidly without any attack in the non IR-exposed areas, resulting in a positive working printing plate. The plate was printed on a Heidelberg GTO46 printing machine with a conventional ink (K+E800) and fountain solution (Rotamatic), resulting in good prints, i.e. no toning in the exposed areas and good ink-uptake in the non imaged areas.

Comparative Example.

In this comparative example an imaging element was prepared in an identical way as the imaging element of example 1 with the exception that no second coating was applied on the first layer.

This material was imaged with a CREO TRENDSETTER 3244-T™ external drum platesetter at 2400 dpi with an energy-density of 263 mJ/cm² at 106 rpm. After IR-imaging the material was developed as described in the previous example. The IR-exposed areas and the non-exposed areas were both dissolved in the developer, resulting in a useless printing plate without image. Development in milder conditions (8 parts EP26/2 parts water) did not provide an improvement.

We claim:

1. A positive-working printing plate precursor for wet lithographic printing comprising a support having a hydrophilic surface and a coating comprising a first layer closest to the support, said first layer containing an oleophilic phenolic resin soluble in an aqueous alkaline developer, a second layer containing an amphyphilic polymer, and an intermediate layer between said first and second layers, wherein (a) the second layer is capable of preventing the aqueous alkaline developer from penetrating into the first layer to an extent that substantially no dissolution of unexposed coating occurs upon immersion in the aqueous alkaline developer during a time period $t_2$;

(b) said capability of the second layer of preventing the aqueous alkaline developer from penetrating into the first layer is reduced upon exposure to heat or light to an extent that substantially complete dissolution of exposed coating occurs upon immersion in the aqueous alkaline developer during a time period $t_1$; $t_2 > t_1$ and $t_2 - t_1$ is at least 10 seconds; and the amphyphilic polymer is a block- or graft-polymer comprising (i) a poly(alkylene oxide) block and (ii) a block comprising siloxane and/or perfluorohydrocarbon units; and (c) said intermediate layer comprises a dye or pigment in an amount higher than the amount of dye or pigment in the first or second layer.

2. A lithographic printing plate precursor according to claim 1 wherein the amphyphilic polymer is present in an amount between 0.5 and 25 mg/m$^2$.

3. A lithographic printing plate precursor according to claim 1 wherein the amphyphilic polymer is present in an amount between 0.5 and 15 mg/m$^2$.

4. A lithographic printing plate precursor according to claim 1 wherein the amphyphilic polymer is present in an amount between 0.5 and 10 mg/m$^2$.

5. A lithographic printing plate precursor according to claim 1 wherein the amphyphilic polymer is present in an amount between 0.5 and 5 mg/m$^2$.

6. A lithographic printing plate precursor according to claim 1 wherein the second layer consists essentially of the amphyphilic polymer.

7. A lithographic printing plate precursor according to claim 1 wherein $t_1$ is 20 and $t_2$ is 40 seconds.

8. A lithographic printing plate precursor according to claim 1 wherein $t_1$ is 10 and $t_2$ is 60 seconds.

9. A lithographic printing plate precursor according to claim 1 wherein the second layer is capable of being removed by rubbing to an extent that substantially complete dissolution of rubbed coating occurs upon immersion in the aqueous alkaline developer during a time period $t_3$ of 10 seconds, said rubbing being defined as rubbing with a cotton pad of a size 85×85 mm at a pressure of 9.69 g/cm$^2$ during 50 cycles, each cycle being defined as a linear translation of the cotton pad on the coating over a distance of 30 cm at a speed of 0.40 m/s.

10. A lithographic printing plate precursor according to claim 9 wherein $t_3$ is 20 seconds.

11. A lithographic printing plate prior according to claim 1 wherein the light is infrared light.

12. A lithographic printing plate precursor according to claim 1 wherein the light is ultraviolet light.

13. A lithographic printing plate precursor according to claim 1 wherein the precursor is not sensitive to ambient daylight.

14. A lithographic printing plate precursor according to claim 1 wherein the second layer is substantially free of dye or pigment.

15. A method of making a lithographic printing plate comprising the steps of image-wise exposure of a lithographic printing plate precursor according to claim 1 and subsequent processing by immersing the precursor in the aqueous alkaline developer during a time period between $t_1$ and $t_2$.

16. A method of wet lithographic printing comprising the steps of making a lithographic printing plate comprising the steps of image-wise exposing a lithographic printing plate precursor according to claim 1 and immersing the image-wise exposed precursor in an aqueous alkaline developer during a time between $t_1$ and $t_2$ to provide a printing plate and printing with the printing plate on a lithographic press wherein ink and an aqueous dampening liquid are supplied to the printing plate.

* * * * *